US011231474B2

(12) United States Patent
Li et al.

(10) Patent No.: US 11,231,474 B2
(45) Date of Patent: Jan. 25, 2022

(54) INVERSION OF NMR ECHO TRAINS USING A SUPPLEMENTARY NONLINEAR EQUALITY CONSTRAINT (71) Applicants: Baoyan Li, Tomball, TX (US); Julio Roberto Arro, Rio Negro (AR); Holger Thern, Hannover (DE); Hasan Kesserwan, AL-Khobar (SA); Guodong Jin, Katy, TX (US)

(72) Inventors: Baoyan Li, Tomball, TX (US); Julio Roberto Arro, Rio Negro (AR); Holger Thern, Hannover (DE); Hasan Kesserwan, AL-Khobar (SA); Guodong Jin, Katy, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 16/839,859

(22) Filed: Apr. 3, 2020

(65) Prior Publication Data
US 2020/0319282 A1 Oct. 8, 2020

Related U.S. Application Data (60) Provisional application No. 62/831,002, filed on Apr. 8, 2019.

(51) Int. Cl.
*G01R 33/50* (2006.01)
*G01V 3/32* (2006.01)
(Continued)

(52) U.S. Cl.
CPC ......... *G01R 33/50* (2013.01); *G01R 33/5608* (2013.01); *G01R 33/5615* (2013.01); *G01V 3/32* (2013.01)

(58) Field of Classification Search
CPC . G01R 33/50; G01R 33/5608; G01R 33/5615
See application file for complete search history.

(56) References Cited

U.S. PATENT DOCUMENTS

2010/0271019 A1* 10/2010 Anand ................. G01R 33/305
324/303
2016/0370492 A1 12/2016 Chen et al.
(Continued)

FOREIGN PATENT DOCUMENTS

WO 2014190261 A2 11/2014

OTHER PUBLICATIONS

Li, et al. "An Efficient, Robust, and Data-Oriented Inversion Method for Noisy T2 Echo Trains." Paper presented at the SPE Annual Technical Conference and Exhibition, Calgary, Alberta, Canada, Sep. 2019. doi: https://doi.org/10.2118/196191-MS; 16 pages.

(Continued)

*Primary Examiner* — Gregory H Curran
(74) *Attorney, Agent, or Firm* — Cantor Colburn LLP (57) ABSTRACT A method of estimating properties of a resource bearing formation includes receiving, by a processor, a measured echo train generated by a nuclear magnetic resonance (NMR) measurement device deployed in a region of interest, and a measured noise of the measured echo train, and calculating a $T_2$ distribution subject to a nonlinear equality constraint, the nonlinear equality constraint dependent on the measured noise and a fitting error between the measured echo train and a modeled echo train. Calculating the $T_2$ distribution includes estimating a solution for the $T_2$ distribution that is closest to satisfying the nonlinear equality constraint.

20 Claims, 8 Drawing Sheets (51) Int. Cl.
    *G01R 33/56*      (2006.01)
    *G01R 33/561*     (2006.01)

(56) References Cited

U.S. PATENT DOCUMENTS

2017/0003412 A1* 1/2017 Bordakov ................ G01V 3/32
2017/0241921 A1* 8/2017 Chen .................... G01N 23/223

OTHER PUBLICATIONS

Notification of Transmittal of the International Search Report and the Written Opinion of the International Searching Authority, or the Declaration; PCT/US2020/027134; dated Jul. 14, 2020, 8 pages.

* cited by examiner

INVERSION OF NMR ECHO TRAINS USING A SUPPLEMENTARY NONLINEAR EQUALITY CONSTRAINT

BACKGROUND

Understanding the characteristics of geologic formations and fluids located therein is important for effective hydrocarbon exploration and production. Operations such as drilling, formation evaluation and production rely on accurate petrophysical interpretation derived from a diverse set of logging technologies.

Nuclear Magnetic Resonance (NMR) is a technique that is used in the energy industry to estimate properties of subterranean formations. NMR typically involves applying a constant magnetic field and an oscillating magnetic field to a formation region, and detecting NMR signals due to voltage induced in a detector by precession of the nuclear spins of atomic nuclei in the region. NMR signals can be analyzed to estimate formation properties such as porosity, permeability and fluid saturations.

SUMMARY

An embodiment of a method of estimating properties of a resource bearing formation includes receiving, by a processor, a measured echo train generated by a nuclear magnetic resonance (NMR) measurement device deployed in a region of interest, and a measured noise of the measured echo train, and calculating a $T_2$ distribution subject to a nonlinear equality constraint, the nonlinear equality constraint dependent on the measured noise and a fitting error between the measured echo train and a modeled echo train. Calculating the $T_2$ distribution includes estimating a solution for the $T_2$ distribution that is closest to satisfying the nonlinear equality constraint.

An embodiment of a system for estimating properties of a resource bearing formation includes an input device configured to receive a measured echo train generated by a nuclear magnetic resonance (NMR) measurement device deployed in a region of interest, and a measured noise of the measured echo train. The system also includes a processing device configured to calculate a $T_2$ distribution subject to a nonlinear equality constraint, the nonlinear equality constraint dependent on the measured noise and a fitting error between the measured echo train and a modeled echo train. Calculating the $T_2$ distribution includes estimating a solution for the $T_2$ distribution that is closest to satisfying the nonlinear equality constraint.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Methods, systems and apparatuses for calculating or estimating properties of resource bearing formations using magnetic resonance techniques are described herein. Systems and methods are provided for performing nuclear magnetic resonance measurements, and estimating or calculating properties such as porosity, permeability and fluid saturation based on inversion of $T_2$ distributions.

An embodiment of an inversion method is provided to compute an optimal solution for a $T_2$ distribution based on echo train data and measured noise. The inversion method utilizes a new smoothing factor for suppressing the sensitivity of the solution for the $T_2$ distribution to the measured noise of echo trains, and a new objective function to optimize the solution for the $T_2$ distribution. The objective function is defined as the squared Euclidean distance between one or more modeled echo trains and one or more measured echo trains, and includes a regularization factor or term for suppressing the noise effects on the one or more modeled echo trains. The objective function has the value of half of the total sum of squared measured noise of an echo train (or echo trains) and squared fitting errors between one or more measured echo trains and one or more modeled echo trains, if the estimated $T_2$ distribution is convergent to the true $T_2$ distribution. The optimal solution for the $T_2$ distribution is the unique solution that minimizes the objective function and satisfies a new nonlinear equality constraint. The smoothing factor, in one embodiment, is defined as a ratio of the $L^2$-norm of measured noise to the $L^2$-norm of the optimal solution for the $T_2$ distribution.

In one embodiment, a processing device is configured to calculate the optimal solution for the $T_2$ distribution according to a nonlinear optimization algorithm. According to the algorithm, an initial solution or selected value of the smoothing factor is proposed, and an initial search range for the smoothing factor is determined based on the initial selected value of the smoothing factor. The algorithm directs an iterative process where, for each iteration, a new solution for the $T_2$ distribution is calculated and a new search range is determined. In addition, a new value for the smoothing factor is determined and the new search range is determined by reducing the search range of a previous iteration. The iteration process continues until the search range for the smoothing factor is below a selected range.

Embodiments described herein provide a number of advantages and technical effects. For example, the embodiments provide an efficient, robust and data-oriented method for inversion of echo trains, including noisy echo trains. In addition, the embodiments provide a more accurate estimation than conventional techniques, which can be executed with a smaller computational cost than conventional techniques.

Figure 1:
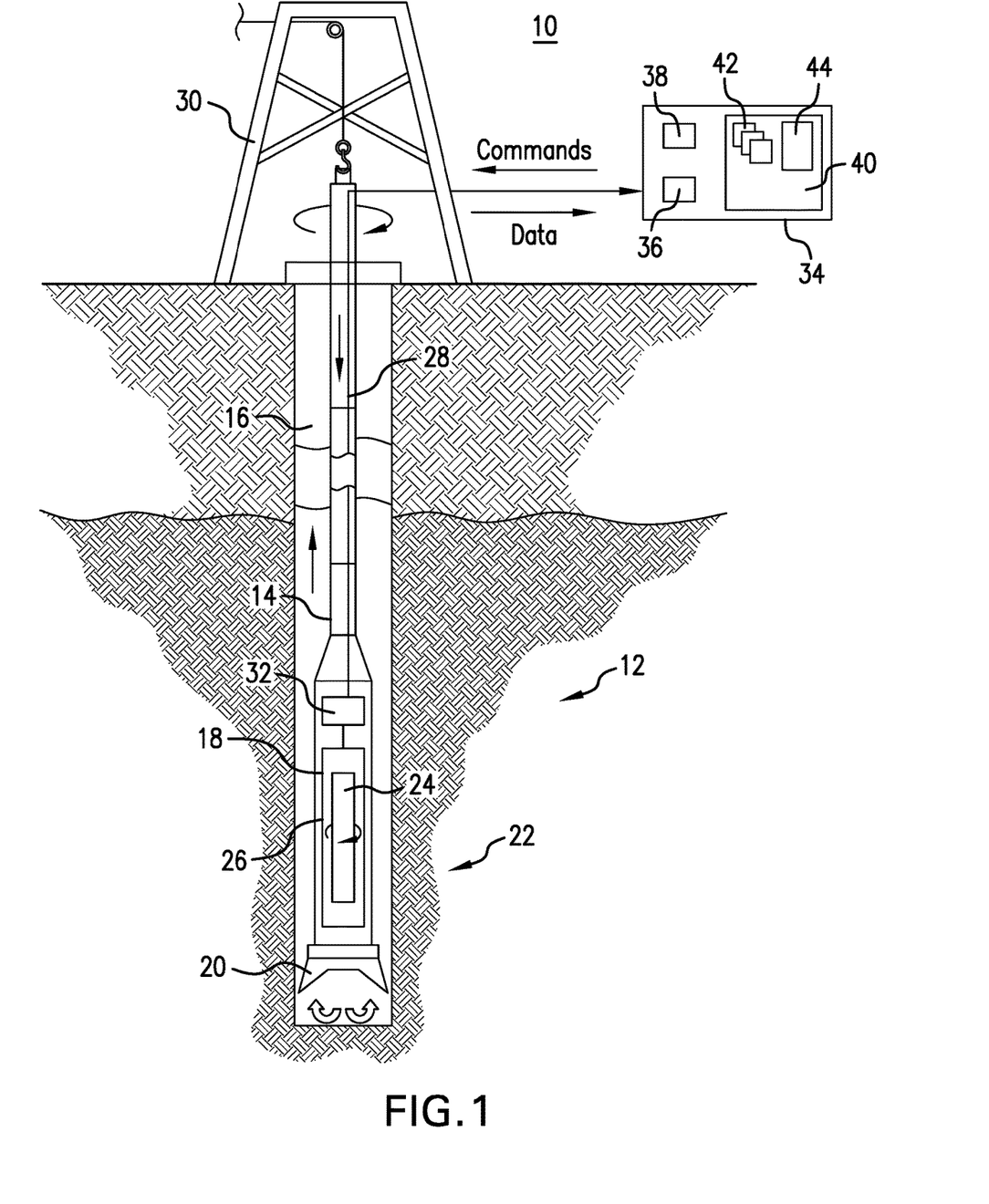
FIG. 1 depicts an embodiment of a drilling and formation measurement system that includes a nuclear magnetic resonance (NMR) measurement device.

FIG. 1 illustrates an exemplary embodiment of a drilling and/or measurement system 10 that includes devices or systems for in-situ measurement of characteristics of a resource bearing formation 12. The system 10 includes a borehole string 14 (or simply "string") configured to be deployed in a borehole 16 that extends through the formation 12.

The system 10 includes a magnetic resonance device such as an NMR tool 18. The tool 18 is configured to generate magnetic resonance data for use in estimating fracture characteristics of a formation, and/or other characteristics such as porosity, pore size, irreducible water saturation, permeability, hydrocarbon content, fluid viscosity and others. The tool 18 may be configured as a component of various subterranean systems, such as wireline well logging and logging-while-drilling (LWD) systems.

In the embodiment of FIG. 1, the borehole string 14 is a drill string 14 that includes, e.g., a plurality of pipe sections and a drill bit 20. The tool 18 can be incorporated within the drill string 14, for example in a bottomhole assembly (BHA) 22, during a drilling operation or LWD operation.

The NMR tool 18 includes a static magnetic field source 24, such as a permanent magnet assembly, that magnetizes formation materials and a transmitter and/or receiver assembly 26 (e.g., an antenna or antenna assembly) that transmits radio frequency (RF) energy or pulsed energy that provides an oscillating magnetic field in the formation, and detects NMR signals as voltages induced in the receiver. The assembly 26 may serve the receive function, or distinct receiving antennas may be used for that purpose.

In one embodiment, the NMR tool 18 and/or other downhole components are equipped with transmission equipment to communicate with other downhole components and/or with surface devices or components. For example, transmission equipment such as a cable 28 extends from the BHA 22 to surface equipment such as a drill rig 30. The transmission equipment may take any desired form, and different transmission media and methods may be used, such as wired, fiber optic, mud pulse telemetry and/or other wireless transmission methods.

The cable 28 or other transmission equipment can be used to communicate with one or more processing devices, such as a downhole electronics unit 32 and/or a surface processing unit 34. The processing device or devices include various electronic components to facilitate receiving signals and collecting data, transmitting data and commands, and/or controlling one or more aspects of an energy industry operation such as an LWD operation.

For example, the processing unit 34 includes an input/output device 36, a processor 38, and a data storage device 40 (e.g., memory, computer-readable media, etc.) for storing data 42 such as measurement data (e.g., echo train data and/or noise measurements), models, $T_2$ distributions and others. The data storage device 40 also stores computer programs or software 44 that cause the processor to perform aspects of methods and processes described herein. The surface processing unit 34 (and/or the downhole electronics unit 32) may be configured to perform functions such as controlling drilling and steering, controlling the pumping of borehole fluid and/or cement injection, transmitting and receiving data, processing measurement data, and/or monitoring operations of the system 10. The surface processing unit 34 and/or an operator can control operational parameters such as drilling direction and fluid flow, and may also facilitate planning other operations, such as production and hydraulic fracturing operations. For example, the surface processing unit 34 is configured as a surface control unit which controls various parameters such as rotary speed, weight-on-bit, fluid flow parameters (e.g., pressure and flow rate) and others.

The surface processing unit 34, electronics unit 32 and/or other suitable processing device includes a processor configured to perform NMR measurements of a region or volume of interest in a formation, analyze NMR measurements and/or estimate properties of the formation based on the NMR measurements.

In one embodiment, the surface processing unit 34 is configured to perform a method that includes receiving NMR measurement data (e.g., echo train data), estimating a $T_2$ distribution, and estimating one or more properties of a formation or formation region. Although the methods described herein are discussed as being performed by a processor or processing device, the methods are not so limited. For example, one or more aspects of the methods may be performed by a human operator or performed by a human operator in conjunction with the processor.

Magnetic resonance measurements are performed by the NMR tool 18, which generates a static magnetic field ($B_0$) in a volume or region within the formation (a "region of interest") using one or more magnets (e.g., the magnetic field source 24). An oscillating magnetic field ($B_1$) is generated, which is at least substantially perpendicular to the static magnetic field in the volume of interest. The region of interest may be circular or toroidal around the borehole, and/or focused or directed toward a specific angular region (i.e., side-looking).

When exposed to the magnetic field $B_0$, the spin axes of hydrogen nuclei in the formation precess around the direction of the $B_0$ field with the Larmor frequency, which is proportional to the strength of the magnetic field $B_0$. Over time, the spin axes align themselves at distinct angles along the $B_0$ field and create a net magnetization (i.e., polarization), which will build up with the time constant $T_1$, referred to as a longitudinal relaxation or spin lattice relaxation time. $T_2$ is a time constant of the transversal relaxation, which describes the loss of magnetization in the plane orthogonal to the $B_0$ field.

The NMR measurements include generating NMR signal echoes from atomic nuclei, such as hydrogen nuclei, of the formation. The NMR signal echoes are recorded as measured echo trains. The NMR measurements yield transverse relaxation times $T_2$, which are exponential decay time constants that correspond to a characteristic or property of formation material. NMR measurements are analyzed by performing an inversion of measurement data to generate a quantitative distribution of $T_2$ values, referred to as a $T_2$ distribution. The process of obtaining this $T_2$ distribution is commonly called $T_2$ inversion. Properties such as total porosity, partial porosities, pore size and fluid type in the formation may be determined from the $T_2$ distribution.

Conventional inversion methods attempt to minimize the sum of squared fitting errors between measured and modeled echo trains by a process of regularization or smoothing. Smoothing is performed to reduce or remove the effects of noise on the optimal solution of the $T_2$ distribution. Generally, inversion methods attempt to minimize such errors by including a regularization term, referred to as a regularization factor or smoothing factor. The smoothing factor reduces the sensitivity of the $T_2$ distribution solution to noise, and can increase the precision of peaks in the $T_2$ distribution.

Conventional methods assume that measured echo trains have white noise, and do not explicitly take into account measured noises in echo trains as part of the inversion process. In downhole applications, the assumption of white noise may not be valid, which results in an incorrect selection of the smoothing factor. Although variants of inversion processes have been developed for optimizing the smoothing factor, the smoothing factor calculated in such processes depends on the selection of optimization parameters, such as the cutoff of fitting errors and levels of smoothing factors to be searched. Incorrect selection of the smoothing factor comprises the accuracy of estimated properties such as porosity, permeability and fluid saturations.

In contrast to conventional methods, which select a value for the smoothing factor and then calculate a fitting error, methods described herein utilize a new supplementary non-linear equality constraint to find a unique and optimal smoothing factor and provide an optimal solution of the $T_2$ distribution that is unaffected or substantially unaffected by noise. Estimation of the $T_2$ distribution and the smoothing factor is a non-linear optimization problem; the value of the objective function is minimized and the smoothing factor is searched over a set of feasible alternatives. The nonlinear equality constraint is based on the fitting errors and measured noise.

Performing an inversion of echo train data includes using a forward model that relates echo train data to properties to be estimated, such as porosity, permeability, fluid saturation and others. In the following discussion, the forward model relates echo train data to porosity. However, the forward model is not so limited and can be adapted for estimation of other properties.

In one embodiment, the forward model used for the inversion of an echo train for long waiting time is represented by the following equation:

$$s(t_k, G, TW) = \sum_j p(T_{2,j}) \cdot e^{-\frac{t_k}{T_{2,j}}} + \varepsilon_k, \quad k = 1, 2, \ldots, N_t, \quad (1)$$

where $t_k$ is the sampling time of the kth echo of the echo train, and the total number of echoes is $N_t$. G is the gradient of the magnetic field $B_0$, and TW is the waiting time. In one embodiment, the waiting time is selected to be sufficient for full polarization of spins under the static magnetic field $B_0$. This waiting time is referred to as a long waiting time or long TW. $s(t_k)$ is the calibrated magnetic momentum signal of spins at sampling time $t_k$, also referred to as an NMR measurement signal or echo train signal. $T_{2,j}$ is the jth bin of $T_2$ transverse relaxation times, where the total number of relaxation time bins is $N_{T2}$. p is the incremental porosity (expressed in porosity units or p.u.), and $p(T_{2,j})$ is the incremental porosity of the jth bin. $\varepsilon_k$ is the fitting error of the kth echo at time $t_k$.

The forward model can also be represented in matrix format as:

$$\begin{bmatrix} e^{-\frac{t_1}{T_{2,1}}} & e^{-\frac{t_1}{T_{2,2}}} & \ldots & e^{-\frac{t_1}{T_{2,N_{T_2}}}} \\ e^{-\frac{t_2}{T_{2,1}}} & e^{-\frac{t_2}{T_{2,2}}} & \ldots & e^{-\frac{t_2}{T_{2,N_{T_2}}}} \\ \vdots & & & \\ e^{-\frac{t_{N_2}}{T_{2,1}}} & e^{-\frac{t_{N_2}}{T_{2,2}}} & \ldots & e^{-\frac{t_{N_t}}{T_{2,N_{T_2}}}} \end{bmatrix} \begin{bmatrix} p_1 \\ p_2 \\ \vdots \\ p_{N_{T_2}-1} \\ p_{N_{T_2}} \end{bmatrix} = \begin{bmatrix} s_1 \\ s_2 \\ \vdots \\ s_{N_t-1} \\ s_{N_t} \end{bmatrix} + \begin{bmatrix} \varepsilon_1 \\ \varepsilon_2 \\ \vdots \\ \varepsilon_{N_t-1} \\ \varepsilon_{N_t} \end{bmatrix}, \quad (2)$$

or, $$Ap = s + \varepsilon,$$

where s is a column vector $[s_1, s_2, s_3 \ldots, s_{Nt-1}, s_{Nt}]^T$, and p is a column vector $[p_1, p_2, p_3 \ldots p_{NT2-1}, p_{NT2}]^T$ representing the $T_2$ distribution. E is a column vector $[\varepsilon_1, \varepsilon_2, \varepsilon_3 \ldots \varepsilon_{Nt-1}, \varepsilon_{Nt}]^T$, and A is the matrix with elements $e^{-tk/T2,j}$. It is noted that an element of A is not limited to the exponential function shown above; other functions such as a gamma function can be utilized.

In one embodiment, the objective function is defined as the squared Euclidean distance between the modeled echo trains (e.g., echo trains modeled according to equations (1) and (2)) and the measured echo trains, and includes the regularization term for suppressing the noise effects on the modeled echo train. The objective function (OBJ) can be represented by the following equation:

$$OBJ = \frac{1}{2} \left\{ \sum_{k=1}^{N_t} \left[ s(t_k) - \sum_{j=1}^{N_{T_2}} p(T_{2,j}) \cdot e^{-\frac{t_k}{T_{2,j}}} \right]^2 + \sum_{j=1}^{N_{T_2}} [\beta p(T_{2,j})]^2 \right\}. \quad (3)$$

The optimal solution for the $T_2$ distribution is the unique solution that minimizes the objective function, satisfying the non-negative constraint for the $T_2$ distribution (i.e., p>0) and with the optimized smoothing factor.

The smoothing factor is denoted as $\beta$, and is used for reducing the sensitivity of the optimal solution of the $T_2$ distribution (which in one embodiment is the incremental porosity distribution in the $T_2$ domain) to the noise n of a measured echo train. In one embodiment, the smoothing factor $\beta$ is defined as the ratio of the $L^2$-norm of measured noise to the $L^2$-norm of the solution for the $T_2$ distribution.

In one embodiment, the smoothing factor $\beta$ is calculated by determining a value for the smoothing factor that satisfies a nonlinear equality constraint. The nonlinear equality constraint is that the $L_2$ norm of the fitting error of the modeled echo train is equal to the $L_2$ norm of noise of the measured echo train, i.e., $\|\varepsilon\|_2 = \|n\|_2$.

In one embodiment, the smoothing factor $\beta$ is defined as the ratio of the $L^2$-norm of measured noise to the $L^2$-norm of the solution of $T_2$ distribution (the incremental porosity) p. The smoothing factor $\beta$ can be represented by the equation:

$$\beta = \frac{\|n\|_2}{\|p\|_2}, \quad (4)$$

where n is a vector of measured noise. $\| \|_2$ is the $L^2$ norm of a vector. The objective function OBJ can be rewritten as a function of measured noise n and the fitting error $\varepsilon$ as follows:

$$OBJ = \frac{1}{2}[(s-Ap)^T(s-Ap) + \beta^2 p^T p] = \frac{1}{2}(\|\varepsilon\|_2^2 + \|\beta p\|_2^2) \quad (5)$$

where T is the transpose operator.

In one embodiment, the processing device is configured to compute the optimal solution for the $T_2$ distribution using an iterative algorithm, which utilizes an initially selected value for the smoothing factor (also referred to as a guess solution or initial guess value). The initial guess solution may be based on, for example, smoothing factor solutions taken from previous measurements or simulations.

In one embodiment, the initial guess value is based on the measured echo train and its measured noise. The initial guess value for the smoothing factor (denoted as $\beta_{init}$) is calculated as follows:

$$\beta_{init} = c \frac{\|n\|_2}{|s(t_1)|}. \tag{6}$$

The constant c is selected to improve the accuracy of initial guess value of the smoothing factor. The constant c can be selected as any suitable value. For example, the value for the constant c can be selected as 4. In one embodiment, c can be selected to make the initial guess value of $\beta$ be close to the value of $\beta$ as defined in Eq. (4).

The initial guess value $\beta_{init}$ is used to calculate its initial search range. The initial search range is used to calculate solutions for a new value of the smoothing factor and a new solution of $T_2$ distribution (p), as well as a new search range for the smoothing factor. For each iteration, a new solution for the $T_2$ distribution is found. In addition, for each iteration, the new search range is found by shrinking or reducing the previous search range, and a new value of the smoothing factor ($\beta_i$) is determined based on the new search range. For example, the new value of the smoothing factor is selected as the median point in the new search range. The algorithm iterates until the search range for a selected smooth factor is below a selected error tolerance $\varepsilon$. At that point, the smooth factor is considered as the optimum smooth factor and the resultant $T_2$ distribution can be calculated and is considered the optimum solution.

Figure 2:
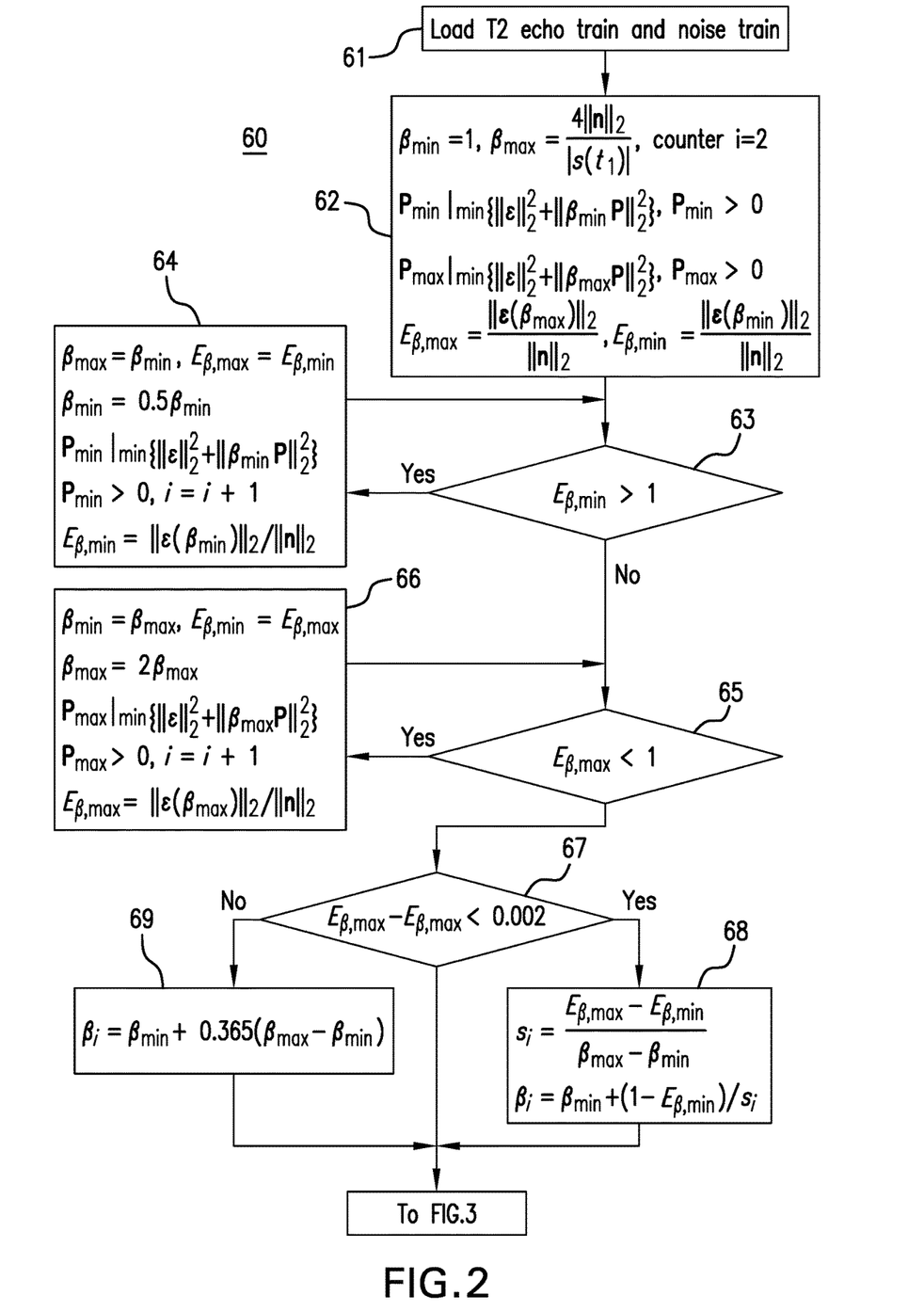
FIG. 2 is a flow chart that depicts aspects of an embodiment of a method of performing an inversion of echo train signals measured by a NMR measurement device.
Figure 3:
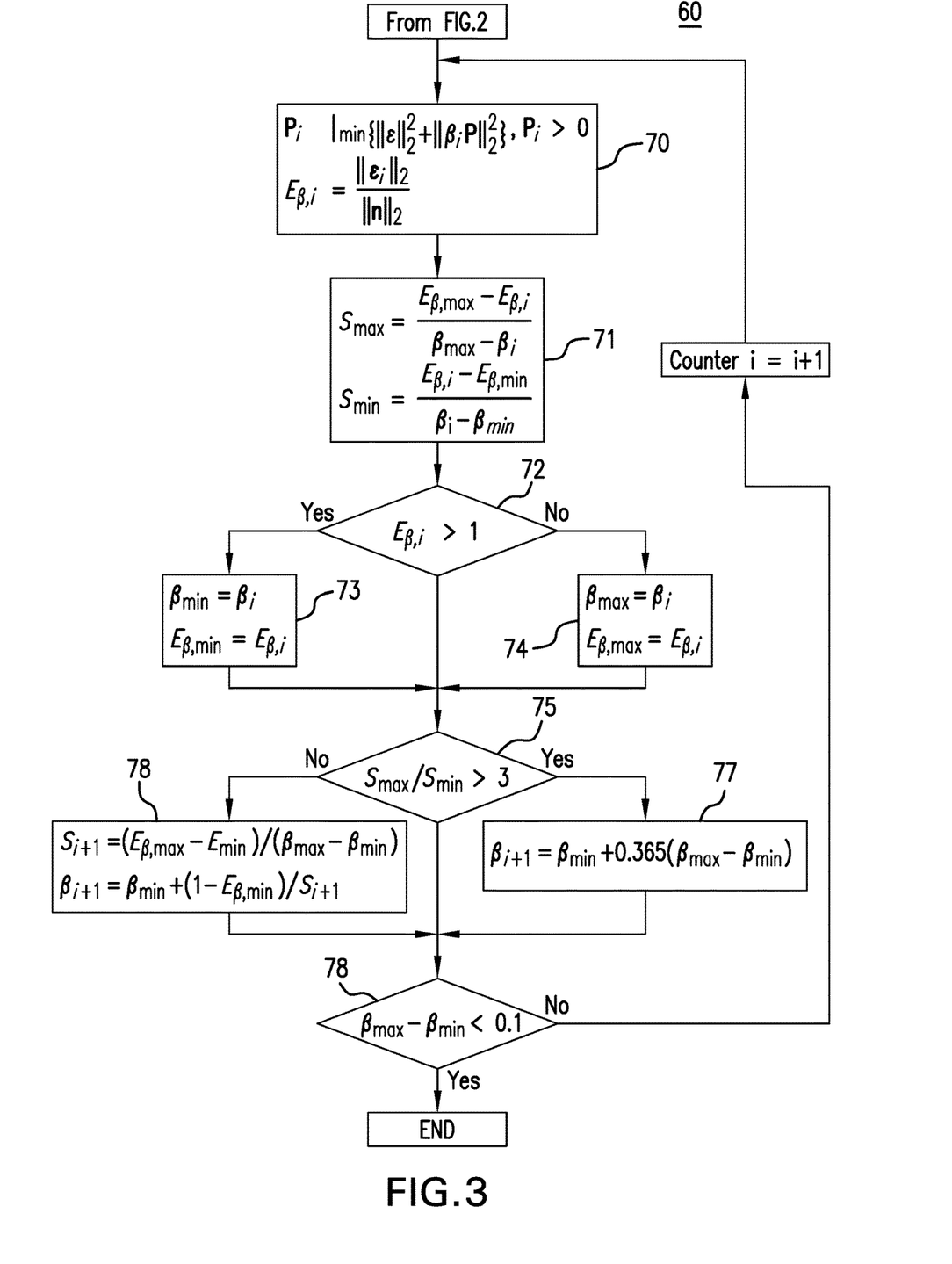
FIG. 3 is a flow chart that depicts additional aspects of the method of FIG. 2.

FIGS. 2 and 3 are block diagrams showing a method 60 of performing an inversion of echo train data, which utilizes the algorithm discussed above. The method 60 includes a number of stages 61-79. In one embodiment, the method 60 includes the execution of all of stages 61-79 in the order described. However, certain stages may be omitted, stages may be added, or the order of the stages changed.

The method 60 is described in conjunction with the system 10 of FIG. 1, but is not so limited. The method 60 may be used with any device or system that performs NMR measurements and/or receives NMR measurement data.

At stage 61, echo train data and measured noise data (noise train) are input to a processing device such as the surface processing unit 34.

At stage 62, an initial guess value for the smoothing factor ($\beta_{init}$), and an initial searching range for the smoothing factor are determined. The initial range is bounded by a maximum smoothing factor ($\beta_{max}$) and a minimum smoothing factor ($\delta_{max}$). The goal of the method 60 is to determine an optimum value of the smoothing factor that minimizes the objective function. In this embodiment, the smoothing factor is selected that results in a solution of the $T_2$ distribution that comes closest to satisfying the normalized nonlinear equality constraint, i.e., results in a value of a normalized equality condition ($E_\beta$) that is closest to one.

The optimal solution ($p_{opt}$) of the $T_2$ distribution is the solution that minimizes the objective function OBJ, described as follows:

$$p_{opt} = p|_{min\{\frac{1}{2}[(s-Ap)^T(s-Ap)+\beta^2 p^T p]\}} = p|_{min\{\frac{1}{2}(\|\varepsilon\|_2^2+\|\beta p\|_2^2)\}}, \tag{7}$$

It is equivalent to the solution:

$$p_{opt}=p|_{min\{\|\|\varepsilon\|_2^2+\|\beta p\|_2^2\}\}}. \tag{8}$$

This optimal solution satisfies the non-negative constraint:

$$p>0 \tag{9}$$

and the nonlinear equality constraint:

$$\|n\|_2=\|\varepsilon\|_2. \tag{10}$$

As shown, the solution p is selected to be non-negative, and the $L^2$-norm of the fitting error $\varepsilon$ is considered equal to the $L^2$-norm of the measured noise n. This optimization problem is a non-negative least squares problem with an additional nonlinear equality constraint.

In one embodiment, an iterative algorithm is used to solve this nonlinear optimization problem. The initial minimum and maximum values of the smoothing factor are set as:

$$\beta_{min} = 1, \beta_{max} = \frac{4\|n\|_2}{|s(t_1)|}, \tag{11}$$

and the normalized equality condition $E_\beta$ values (also referred to as error norm ratio values) corresponding to the maximum and minimum searched smoothing factor are computed by:

$$E_{\beta,max} = \frac{\|\varepsilon(\beta_{max})\|_2}{\|n\|_2}, E_{\beta,min} = \frac{\|\varepsilon(\beta_{min})\|_2}{\|n\|_2}, \tag{12}$$

where $E_{\beta,max}$ is the normalized equality condition corresponding to $\beta_{max}$, and $E_{\beta,min}$ is the normalized equality condition corresponding to $\beta_{min}$. The solutions of $T_2$ distributions $p_{min}$ and $p_{max}$, corresponding to $\beta_{min}$ and $\beta_{max}$, are calculated with the iterative non-negative least squares algorithm to solve the non-negative least squares problem.

At stage 63, the processing device determines whether $E_{\beta,min}$ is greater than one. If so, at stage 64, $\beta_{max}$ is reduced to be equal to the initial selected $\beta_{min}$, and $\beta_{min}$ is reduced by half.

At stage 65, the processing device determines whether $E_{\beta,max}$ is less than one. If so, at stage 66, $\beta_{min}$ is increased to be equal to the initial selected $\beta_{max}$, and $\beta_{max}$ is doubled.

$\beta$ ($\beta_i$) at the first iteration is then calculated based on $\beta_{min}$ and $\beta_{max}$.

At stage 67, the range of the normalized equality condition value $E_\beta$ is compared to a selected tolerance range for linearly predicting a new smoothing factor value $\beta_i$ at iteration i. For example, it is determined whether the difference between $E_{\beta,min}$ and $E_{\beta,max}$ is within a selected tolerance range, e.g., a range of about 0.002. At stage 68, if the difference falls within the tolerance range, $\beta_i$ is linearly predicted as follows:

$$\beta_i = \beta_{min} + (1 - E_{\beta,min})/s, \text{ where} \tag{13}$$

$$s_i = \frac{E_{\beta,max} - E_{\beta,min}}{\beta_{max} - \beta_{min}}. \tag{14}$$

At stage 69, if the difference falls outside of the tolerance range for linearization, $\beta_i$ is calculated as follows:

$$\beta_i=\beta_{min}+0.365(\beta_{max}-\beta_{min}).$$

Referring to FIG. 3, at stage 70, for the current iteration of $\beta_i$, the solution for the $T_2$ distribution ($p_i$) is calculated using the non-negative least squares algorithm, and a modeled echo train $s_i$ is calculated. A fitting error $\varepsilon_i$ of the modeled echo train for the current iteration can be determined, and the current normalized equality condition $E_{\beta,i}$ is calculated based on fitting error $\varepsilon_i$ and measured noise n of the echo train.

At stage 71, the slope values of the normalized equality condition value $E_\beta$ are determined, indicated by $s_{max}$ and $s_{min}$. $s_{max}$ and $s_{min}$ can be calculated according to the following equations:

$$s_{max} = \frac{E_{\beta,max} - E_{\beta,i}}{\beta_{max} - \beta_i} \quad (15)$$

$$s_{min} = \frac{E_{\beta,i} - E_{\beta,min}}{\beta_i - \beta_{min}}.$$

At stage 72, the normalized equality condition value $E_{\beta,i}$ is compared to one, and the search range of $\beta_i$ is adjusted. At stage 73, if $E_{\beta,i}$ is less than one, $\beta_{min}$ is updated with $\beta_i$. At stage 74, if $E_{\beta,i}$ is greater than one, $\beta_{max}$ is updated with $\beta_i$. A new value for $\beta$ ($\beta_{i+1}$) and a new slope ($s_{i+1}$) of the normalized equality condition value $E_\beta$ can now be calculated.

Once the value of $\beta_i$ and the search range of the smoothing factor is determined, at stage 75, the ratio of $s_{max}$ to $s_{min}$ is calculated and compared to a selected value, e.g., a value of three. At stage 76, if the ratio is less than the selected value, $\beta_{i+1}$ is calculated as:

$$\beta_{i+1} = \beta_{min} + (1 - E_{\beta,min}) / s_{i+1}, \text{ where} \quad (16)$$

$$s_{i+1} = (E_{\beta,max} - E_{\beta,min}) / (\beta_{max} - \beta_{min}). \quad (17)$$

At stage 77, if the ratio is greater than three, $\beta_{i+1}$ is calculated as:

$$\beta_{i+1} = \beta_{min} + 0.365(\beta_{max} - \beta_{min}). \quad (18)$$

At stage 78, the search range is compared to an error tolerance. For example, the processing device determines whether the difference between $\beta_{min}$ and $\beta_{max}$ is less than an error tolerance, e.g., a tolerance of 0.1. If not, stages 70-78 are repeated using the smoothing factor value of $\beta_{i+1}$.

At stage 79, if the search range of the smoothing factor is within the error tolerance, the final iteration is reached to obtain the final optimal solutions of the smoothing factor and the $T_2$ distribution.

FIGS. 4-7 illustrate examples of $T_2$ distributions calculated according to the methods described herein. In these examples, echo trains (synthetic measured echo trains) were generated from known $T_2$ distributions. The echo trains were inverted according to the method 60.

Figure 4:
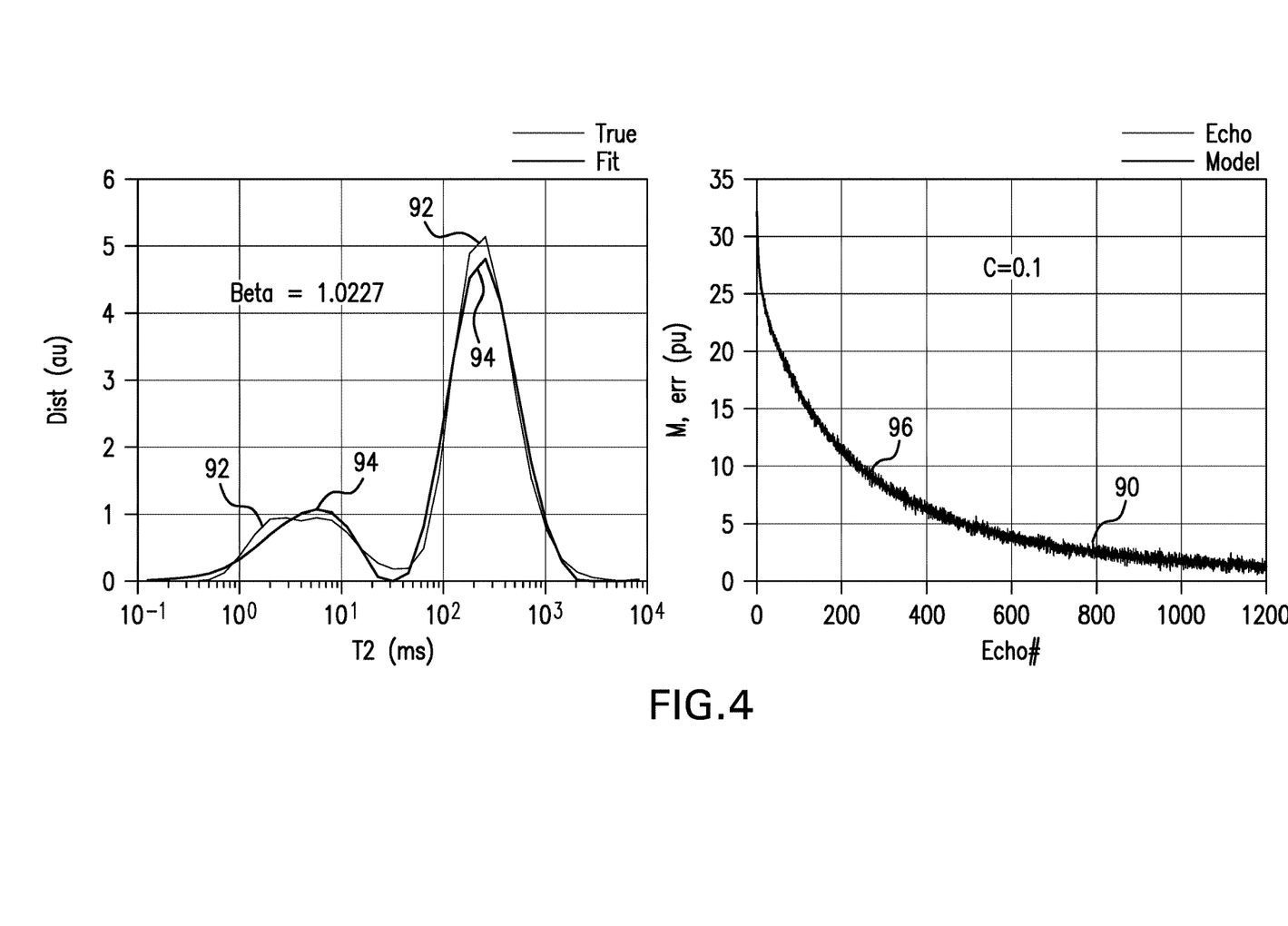
FIG. 4 depicts an example of a $T_2$ distribution and the fitting of echo train data calculated according to the method of FIGS. 2 and 3.
Figure 5:
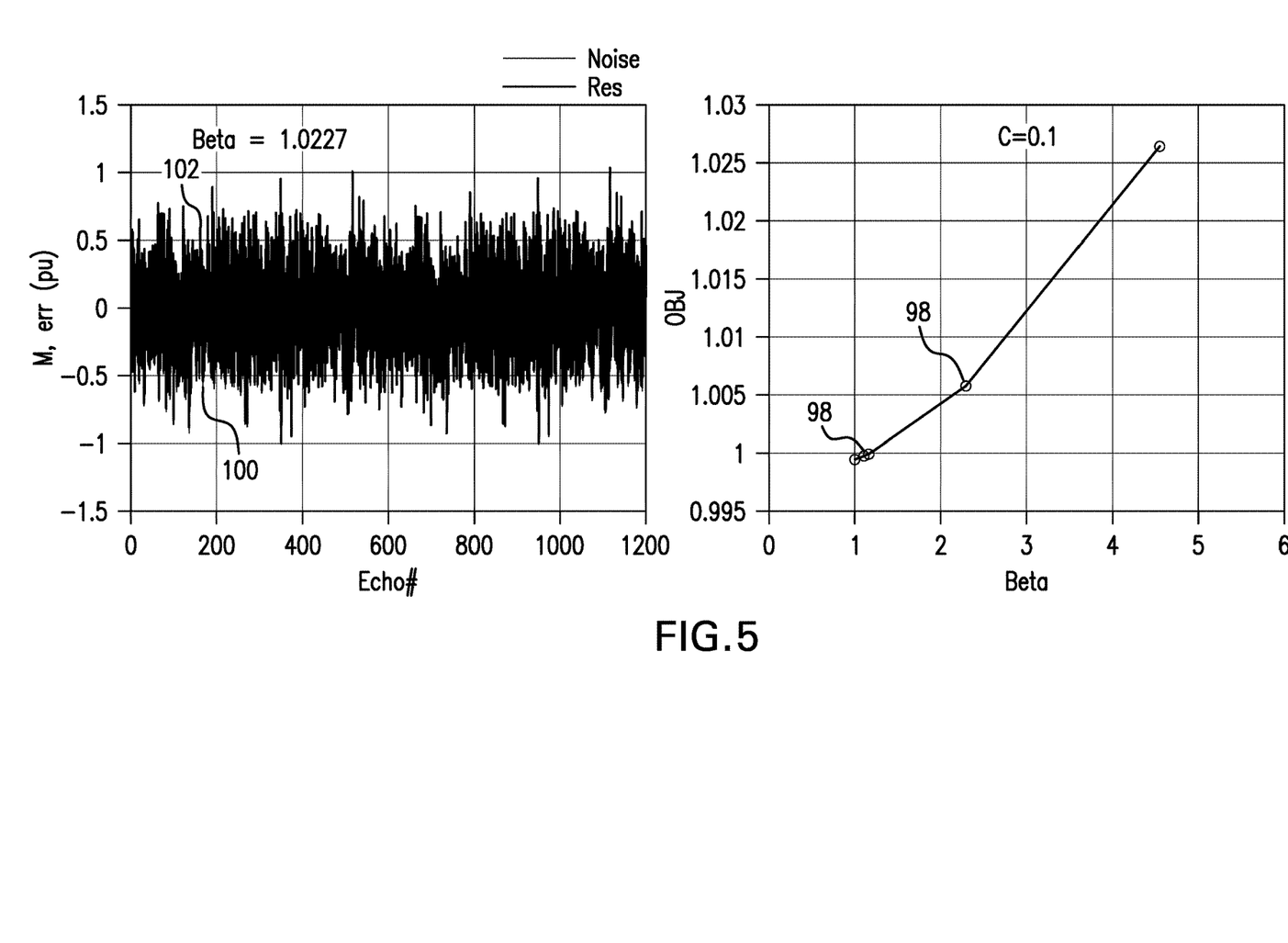
FIG. 5 depicts an example of measured noise data and a graph illustrating selection of a smoothing factor used to calculate the $T_2$ distribution of FIG. 5.

Referring to FIGS. 4 and 5, in one example, a synthetic measured echo train 90 of the core samples is shown, and the known $T_2$ distribution 92 is also shown. In this example, the noise level is relatively small (C=0.1). An estimated $T_2$ distribution 94, which was calculated based on the method 60 is also shown, and the modeled echo train 96 is shown. In this example, for the noise level C=0.1, the optimum value for the smoothing factor was calculated as 1.0227. It can be seen that the estimated $T_2$ distribution shows a good fitting to the known $T_2$ distribution, and the modeled echo train provides a good approximation of the synthetic measured echo train.

FIG. 5 illustrates the iterations performed in the method 60 for this example. The iteration process is shown in a graph of normalized equality condition values, which are a function of the smoothing factor $\beta$. Each point 98 in the graph corresponds to an iteration, which produced successive $\beta$ values until the optimum $\beta$ value (the $\beta$ value that makes the normalized equality condition value $E_\beta$ closest to one) was found. FIG. 5 also shows the measured noise 100 as compared to the fitting errors 102 of the modeled echo train according to the method 60.

Figure 6:
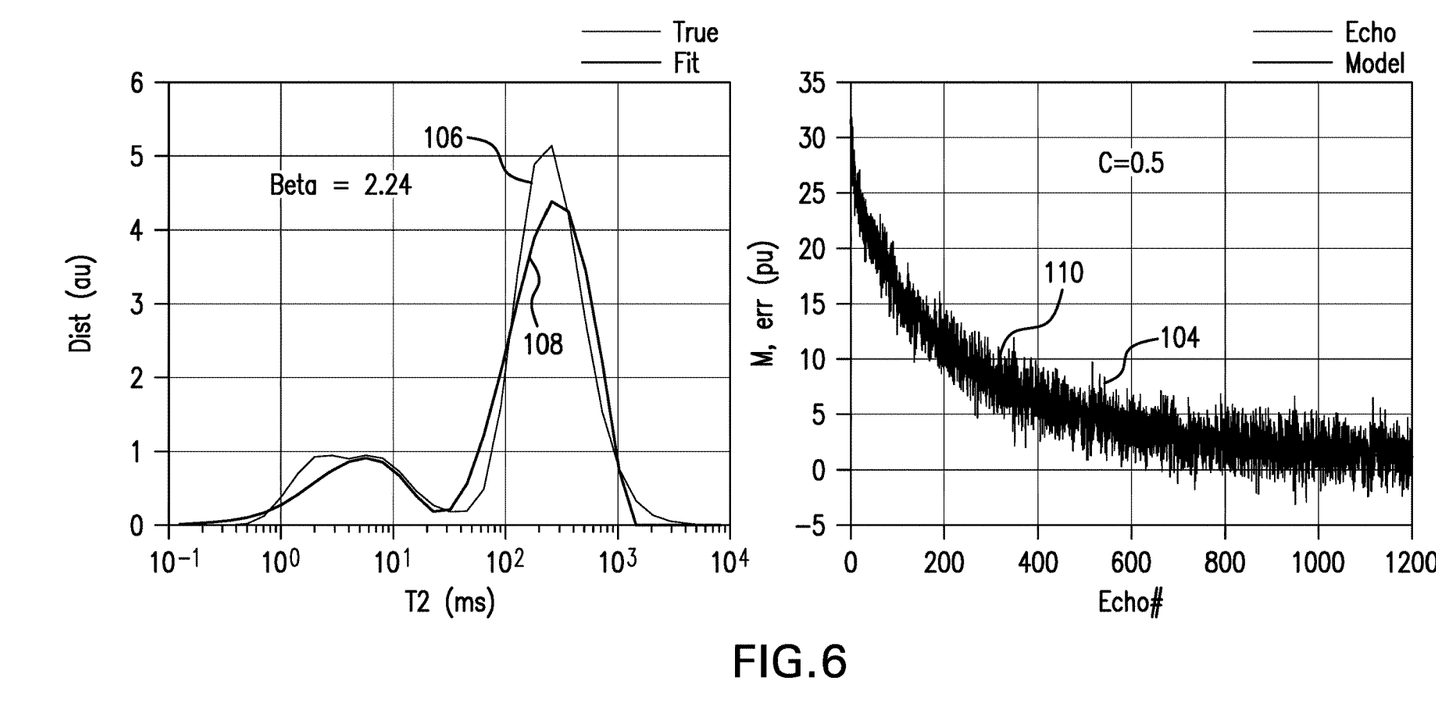
FIG. 6 depicts another example of a $T_2$ distribution and the fitting of echo train data calculated according to the method of FIGS. 2 and 3.
Figure 7:
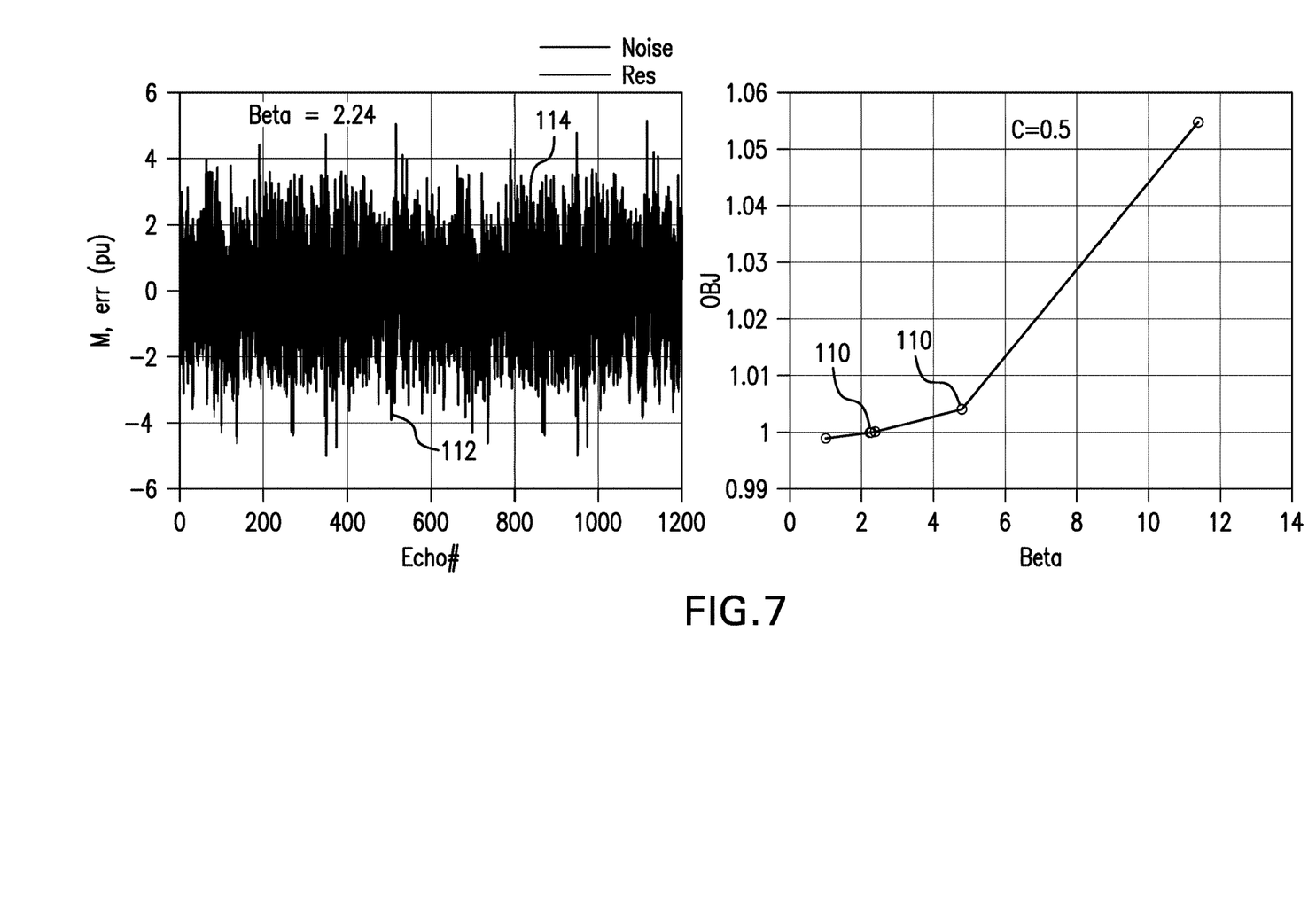
FIG. 7 depicts an example of measured noise data and a graph illustrating selection of a smoothing factor used to calculate the $T_2$ distribution of FIG. 6.

FIGS. 6 and 7 show an inversion example of a measured echo train 104 corresponding to a known $T_2$ distribution 106. This example represents a more noisy echo train, having a noise level C=0.5. An estimated $T_2$ distribution 108, which was calculated based on the method 60 is also shown, and a modeled echo train 110 is shown. In this example, the optimum value for the smoothing factor was calculated as 2.24. FIG. 7 illustrates the searching iterations of $\beta$ values as points 110, and the measured noise 112 as compared to the fitting errors 114 of the modeled echo train according to the method 60. This example demonstrates that the method 60 can produce an accurate estimated $T_2$ distribution under noisy conditions with only a few iterations.

The $T_2$ distributions shown in the above examples are plotted as amplitude values in arbitrary units (a.u.) as a function of $T_2$ values. The amplitude values can be representative of one or more properties of a formation, such as incremental porosity (e.g., as porosity units or p.u.).

Figure 8:
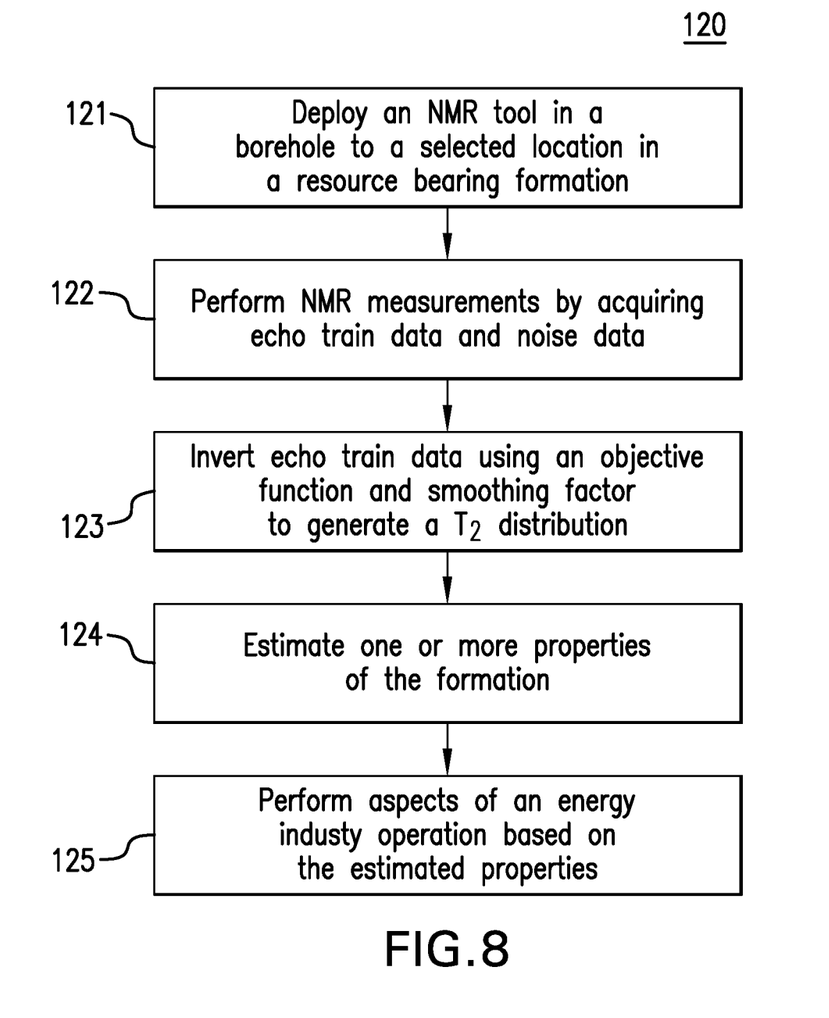
FIG. 8 is a flow chart that depicts aspects of an embodiment of a method of estimating properties of a resource bearing formation using NMR measurements.

FIG. 8 illustrates a method 120 of performing NMR measurements and estimating properties of a formation. The method 120 may be performed in conjunction with the system 10, but is not limited thereto. The method 120 includes one or more of stages 121-125 described herein, at least portions of which may be performed by a processor (e.g., the surface processing unit 34). In one embodiment, the method 120 includes the execution of all of stages 121-125 in the order described. However, certain stages may be omitted, stages may be added, or the order of the stages changed.

In the first stage 121, the NMR tool 18 or other magnetic resonance measurement tool is deployed into a borehole to a selected location. In one embodiment, the NMR tool 18 is deployed as part of a wireline operation, or during drilling as part of an LWD operation. The speed at which the NMR tool 18 is advanced is referred to as logging speed.

In the second stage 122, when the NMR tool 18 is located at the selected location, NMR measurements are performed by generating a static magnetic field $B_0$ in a volume or region of interest around the selected location (a formation or formation region), and transmitting pulsed signals from at least one transmitting antenna into the region of interest. At least one receiving antenna detects NMR signals from the region of interest in response to the interaction between the nuclear spins of interest and the static and oscillating magnetic fields, and generates echo trains that may be measured at a plurality of depths or locations.

In the third stage 123, the NMR measurement data including raw time domain echo trains are processed to calculate a $T_2$ distribution by inverting the echo train data into the $T_2$ domain according to methods described herein (e.g., the method 60).

In the fourth stage 124, properties of the region of interest are estimated based on the T2 distribution. For example, the T2 distribution can be associated with porosity. Other properties that can be estimated include permeability, fluid saturation, fluid types and others.

In the fifth stage 125, aspects of an energy industry operation are performed based on the estimated properties (e.g., operational parameters are planned and/or adjusted). Examples of energy industry operations include drilling, stimulation, formation evaluation, measurement and/or production operations. For example, estimations of porosity can be used to control drilling direction and find productive zones that can be targeted for production.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

Set forth below are some embodiments of the foregoing disclosure:

Embodiment 1

A method of estimating properties of a resource bearing formation, the method comprising: receiving, by a processor, a measured echo train generated by a nuclear magnetic resonance (NMR) measurement device deployed in a region of interest, and a measured noise of the measured echo train; and calculating a $T_2$ distribution subject to a nonlinear equality constraint, the nonlinear equality constraint dependent on the measured noise and a fitting error between the measured echo train and a modeled echo train, wherein calculating the $T_2$ distribution includes estimating a solution for the $T_2$ distribution that is closest to satisfying the nonlinear equality constraint.

Embodiment 2

The method as in any prior embodiment, wherein estimating the solution includes minimizing an objective function, the objective function including a regularization factor configured to reduce a sensitivity of the estimated solution to noise in the measured echo train.

Embodiment 3

The method as in any prior embodiment, wherein the objective function is minimized based on a constraint specifying that the $T_2$ distribution is non-negative.

Embodiment 4

The method as in any prior embodiment, wherein the regularization factor is defined as a ratio of an $L^2$-norm of the measured noise to an $L^2$-norm of a solution for the $T_2$ distribution.

Embodiment 5

The method as in any prior embodiment, wherein the nonlinear equality constraint is that the $L^2$-norm of the fitting error is equal to the $L^2$-norm of the measured noise.

Embodiment 6

The method as in any prior embodiment, wherein estimating the solution includes: selecting an initial value ($\beta_{init}$) of the regularization factor based on the measured noise and the measured echo train, calculating an initial search range based on the initial value $\beta_{init}$, and calculating a $T_2$ distribution; iteratively calculating a solution of the $T_2$ distribution, a search range and a solution of the regularization factor until the search range is below a selected error tolerance; and selecting the solution of the regularization factor associated with the search range that is below the selected error tolerance, and estimating the solution for the $T_2$ distribution based on the selected solution of the regularization factor.

Embodiment 7

The method as in any prior embodiment, wherein the objective function (OBJ) is defined as:

$$OBJ = \tfrac{1}{2}(\|\varepsilon\|_2^2 + \|\beta p\|_2^2),$$

wherein p is a solution of the $T_2$ distribution, $\varepsilon$ is the fitting error and $\beta$ is a solution of the regularization factor.

Embodiment 8

The method as in any prior embodiment, wherein the solution is a non-negative solution ($p_{opt}$) that minimizes the objective function and is based on:

$$p_{opt} = p|_{min\{\|\varepsilon\|_2^2 + \|\beta p\|_2^2\}},$$

wherein the non-negative solution $p_{opt}$ satisfies the nonlinear equality constraint represented by:

$$\|n\|_2 = \|\varepsilon\|_2.$$

Embodiment 9

The method as in any prior embodiment, wherein each search range of the regularization factor is based on a minimum value and a maximum value of a normalized equality condition, the normalized equality condition is defined as a ratio of the $L^2$-norms of the fitting error and the measured noise.

Embodiment 10

The method as in any prior embodiment, wherein the minimum value ($E_{\beta,min}$) of the normalized equality condition is based on:

$$E_{\beta,min} = \frac{\|\varepsilon(\beta_{min})\|_2}{\|n\|_2},$$

wherein $\beta_{min}$ is a selected minimum value of the regularization factor and n is the measured noise, and the maximum value ($E_{\beta,max}$) of the normalized equality condition is based on:

$$E_{\beta,max} = \frac{\|\varepsilon(\beta_{max})\|_2}{\|n\|_2},$$

wherein $\beta_{max}$ is a selected maximum value of the regularization factor.

Embodiment 11

The method as in any prior embodiment, further comprising controlling an energy industry operation based on the estimated solution.

Embodiment 12

A system for estimating properties of a resource bearing formation, the system comprising: an input device configured to receive a measured echo train generated by a nuclear magnetic resonance (NMR) measurement device deployed in a region of interest, and a measured noise of the measured echo train; and a processing device configured to perform: calculating a $T_2$ distribution subject to a nonlinear equality constraint, the nonlinear equality constraint dependent on the measured noise and a fitting error between the measured echo train and a modeled echo train, wherein calculating the $T_2$ distribution includes estimating a solution for the $T_2$ distribution that is closest to satisfying the nonlinear equality constraint.

Embodiment 13

The system as in any prior embodiment, wherein estimating the solution includes minimizing an objective function, the objective function including a regularization factor configured to reduce a sensitivity of the estimated solution to noise in the measured echo train.

Embodiment 14

The system as in any prior embodiment, wherein the objective function is minimized based on a constraint specifying that the $T_2$ distribution is non-negative, and the regularization factor is defined as a ratio of an $L^2$-norm of the measured noise to an $L^2$-norm of the solution for the $T_2$ distribution.

Embodiment 15

The system as in any prior embodiment, wherein the nonlinear equality constraint is that the $L^2$-norm of the fitting error is equal to the $L^2$-norm of the measured noise.

Embodiment 16

The system as in any prior embodiment, wherein estimating the solution includes: selecting an initial value ($\beta_{init}$) of the regularization factor based on the measured noise and the measured echo train, calculating an initial search range based on the initial value $\beta_{init}$, and calculating a $T_2$ distribution; iteratively calculating a solution of the $T_2$ distribution, a search range and a solution of the regularization factor until the search range is below a selected error tolerance; and selecting the solution of the regularization factor associated with the search range that is below the selected error tolerance, and estimating the solution for the $T_2$ distribution based on the selected solution of the regularization factor.

Embodiment 17

The system as in any prior embodiment, wherein the objective function (OBJ) is defined as:

$$OBJ = \tfrac{1}{2}(\|\varepsilon\|_2^2 + \|\beta p\|_2^2)$$

wherein p is a solution of the $T_2$ distribution, $\varepsilon$ is the fitting error and $\beta$ is a solution of the regularization factor.

Embodiment 18

The system as in any prior embodiment, wherein the solution is a non-negative solution ($p_{opt}$) that minimizes the objective function and is based on:

$$p_{opt} = p|_{min\{\|\varepsilon\|_2^2 + \|\beta p\|_2^2\}},$$

wherein the non-negative solution $p_{opt}$ satisfies the nonlinear equality constraint represented by:

$$\|n\|_2 = \|\varepsilon\|_2.$$

Embodiment 19

The system as in any prior embodiment, wherein each search range is based on a minimum value and a maximum value of a normalized equality condition, the normalized equality condition is defined as a ratio of the $L^2$-norms of the fitting error and the measured noise.

Embodiment 20

The system as in any prior embodiment, wherein the minimum value ($E_{\beta,min}$) of the normalized equality condition is based on:

$$E_{\beta,min} = \frac{\|\varepsilon(\beta_{min})\|_2}{\|n\|_2},$$

wherein $\beta_{min}$ is a selected minimum value of the regularization factor and n is the measured noise, and the maximum value ($E_{\beta,max}$) of the normalized equality condition is based on:

$$E_{\beta,max} = \frac{\|\varepsilon(\beta_{max})\|_2}{\|n\|_2},$$

wherein $\beta_{max}$ is a selected maximum value of the regularization factor.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. A method of estimating properties of a resource bearing formation, the method comprising:
    receiving, by a processor, a measured echo train generated by a nuclear magnetic resonance (NMR) measurement device deployed in a region of interest, and a measured noise of the measured echo train; and
    calculating a $T_2$ distribution subject to a nonlinear equality constraint, the nonlinear equality constraint dependent on the measured noise and a fitting error between the measured echo train and a modeled echo train, wherein calculating the $T_2$ distribution includes estimating a solution for the $T_2$ distribution that is closest to satisfying the nonlinear equality constraint, wherein estimating the solution includes minimizing an objective function.

2. The method of claim 1, wherein the objective function includes a regularization factor configured to reduce a sensitivity of the estimated solution to noise in the measured echo train.

3. The method of claim 2, wherein the objective function is minimized based on a constraint specifying that the $T_2$ distribution is non-negative.

4. The method of claim 2, wherein the regularization factor is defined as a ratio of an $L^2$-norm of the measured noise to an $L^2$-norm of a solution for the $T_2$ distribution.

5. The method of claim 4, wherein the nonlinear equality constraint is that the $L^2$-norm of the fitting error is equal to the $L^2$-norm of the measured noise.

6. The method of claim 4, wherein estimating the solution includes:
    selecting an initial value ($\beta_{init}$) of the regularization factor based on the measured noise and the measured echo train, calculating an initial search range based on the initial value $\beta_{init}$, and calculating a $T_2$ distribution;
    iteratively calculating a solution of the $T_2$ distribution, a search range and a solution of the regularization factor until the search range is below a selected error tolerance; and
    selecting the solution of the regularization factor associated with the search range that is below the selected error tolerance, and estimating the solution for the $T_2$ distribution based on the selected solution of the regularization factor.

7. The method of claim 6, wherein the objective function (OBJ) is defined as:

$$OBJ = \frac{1}{2}(\|\varepsilon\|_2^2 + \|\beta p\|_2^2),$$

wherein p is a solution of the $T_2$ distribution, $\varepsilon$ is the fitting error and $\beta$ is a solution of the regularization factor.

8. The method of claim 7, wherein the solution is a non-negative solution ($p_{opt}$) that minimizes the objective function and is based on:

$$p_{opt} = p|_{min\{\|\varepsilon\|_2^2 + \|\beta p\|_2^2\}},$$

wherein the non-negative solution $p_{opt}$ satisfies the nonlinear equality constraint represented by:

$$\|n\|_2 = \|\varepsilon\|_2.$$

9. The method of claim 8, wherein each search range of the regularization factor is based on a minimum value and a maximum value of a normalized equality condition, the normalized equality condition is defined as a ratio of the $L^2$-norms of the fitting error and the measured noise.

10. The method of claim 9, wherein the minimum value ($E_{\beta,min}$) of the normalized equality condition is based on:

$$E_{\beta,min} = \frac{\|\varepsilon(\beta_{min})\|_2}{\|n\|_2},$$

wherein $\beta_{min}$ is a selected minimum value of the regularization factor and n is the measured noise, and the maximum value ($E_{\beta,max}$) of the normalized equality condition is based on:

$$E_{\beta,max} = \frac{\|\varepsilon(\beta_{max})\|_2}{\|n\|_2},$$

wherein $\beta_{max}$ is a selected maximum value of the regularization factor.

11. The method of claim 1, further comprising controlling an energy industry operation based on the estimated solution.

12. A system for estimating properties of a resource bearing formation, the system comprising:
    an input device configured to receive a measured echo train generated by a nuclear magnetic resonance (NMR) measurement device deployed in a region of interest, and a measured noise of the measured echo train; and
    a processing device configured to perform:
    calculating a $T_2$ distribution subject to a nonlinear equality constraint, the nonlinear equality constraint dependent on the measured noise and a fitting error between the measured echo train and a modeled echo train, wherein calculating the $T_2$ distribution includes estimating a solution for the $T_2$ distribution that is closest to satisfying the nonlinear equality constraint, wherein estimating the solution includes minimizing an objective function.

13. The system of claim 12, wherein the objective function includes a regularization factor configured to reduce a sensitivity of the estimated solution to noise in the measured echo train.

14. The system of claim 13, wherein the objective function is minimized based on a constraint specifying that the $T_2$ distribution is non-negative, and the regularization factor is defined as a ratio of an $L^2$-norm of the measured noise to an $L^2$-norm of the solution for the $T_2$ distribution.

15. The system of claim 14, wherein the nonlinear equality constraint is that the $L^2$-norm of the fitting error is equal to the $L^2$-norm of the measured noise.

16. The system of claim 14, wherein estimating the solution includes:
selecting an initial value ($\beta_{init}$) of the regularization factor based on the measured noise and the measured echo train, calculating an initial search range based on the initial value $\beta_{init}$, and calculating a $T_2$ distribution;
iteratively calculating a solution of the $T_2$ distribution, a search range and a solution of the regularization factor until the search range is below a selected error tolerance; and
selecting the solution of the regularization factor associated with the search range that is below the selected error tolerance, and estimating the solution for the $T_2$ distribution based on the selected solution of the regularization factor.

17. The system of claim 16, wherein the objective function (OBJ) is based on:

$$OBJ=\tfrac{1}{2}(\|\varepsilon\|_2^2+\|\beta p\|_2^2),$$

wherein p is a solution of the $T_2$ distribution, $\varepsilon$ is the fitting error and $\beta$ is a solution of the regularization factor.

18. The system of claim 17, wherein the solution is a non-negative solution ($p_{opt}$) that minimizes the objective function and is based on:

$$p_{opt}=p|_{min\{\|\varepsilon\|_2^2+\|\beta p\|_2^2\}},$$

wherein the non-negative solution $p_{opt}$ satisfies the nonlinear equality constraint represented by:

$$\|n\|_2=\|\varepsilon\|_2.$$

19. The system of claim 18, wherein each search range is based on a minimum value and a maximum value of a normalized equality condition, the normalized equality condition is defined as a ratio of the $L^2$-norms of the fitting error and the measured noise.

20. The system of claim 19, wherein the minimum value ($E_{\beta,min}$) of the normalized equality condition is based on:

$$E_{\beta,min}=\frac{\|\varepsilon(\beta_{min})\|_2}{\|n\|_2},$$

wherein $\beta_{min}$ is a selected minimum value of the regularization factor and n is the measured noise, and the maximum value ($E_{\beta,max}$) of the normalized equality condition is based on:

$$E_{\beta,max}=\frac{\|\varepsilon(\beta_{max})\|_2}{\|n\|_2},$$

wherein $\beta_{max}$ is a selected maximum value of the regularization factor.

* * * * *